United States Patent
Hata et al.

(10) Patent No.: US 7,000,166 B2
(45) Date of Patent: Feb. 14, 2006

(54) APPARATUS AND METHOD FOR HEADER DECOMPRESSION

(75) Inventors: Koichi Hata, Katano (JP); Akihiro Miyazaki, Sakai (JP); Koji Imura, Machida (JP); Daiji Ido, Yokohama (JP)

(73) Assignee: Matsushita Electric Industrial Co., Ltd., Osaka-Fu (JP)

( * ) Notice: Subject to any disclaimer, the term of this patent is extended or adjusted under 35 U.S.C. 154(b) by 110 days.

(21) Appl. No.: 10/803,906

(22) Filed: Mar. 19, 2004

(65) Prior Publication Data
US 2004/0181741 A1     Sep. 16, 2004

Related U.S. Application Data

(62) Division of application No. 09/948,765, filed on Sep. 10, 2001.

(30) Foreign Application Priority Data
Sep. 11, 2000  (JP) ............................. 2000-274615
Dec. 1, 2000  (JP) ............................. 2000-367514

(51) Int. Cl.
*H04L 1/00*  (2006.01)
*G06F 11/00*  (2006.01)

(52) U.S. Cl. ........................................ 714/746; 714/704
(58) Field of Classification Search ................ 714/746, 714/747, 748, 704; 370/286, 389, 393
See application file for complete search history.

(56) References Cited

U.S. PATENT DOCUMENTS 6,148,422 A    11/2000  Strawczynski et al.
6,609,224 B1 *  8/2003  Jonsson ....................... 714/758

FOREIGN PATENT DOCUMENTS

| EP | 991 211 A2 | 4/2000 |
| JP | 6-268633 | 9/1994 |
| JP | 2000-101520 | 4/2000 |

OTHER PUBLICATIONS

"Equalisation of CCS No7 link availability" Ž. Markov and B. Trenkié, Electronics Letters, 2nd Apr. 1998, vol. 34, No. 7 XP 6009543.

(Continued)

*Primary Examiner*—Albert Decady
*Assistant Examiner*—James C. Kerveros
(74) *Attorney, Agent, or Firm*—Wenderoth, Lind & Ponack, L.L.P.

(57) ABSTRACT

In a header decompression apparatus 709, a header decompressor 703 refers to reference information stored in a reference information manager 707 to decompress a compressed header of a packet received by a packet receiver 704. An error detector 702 detects a CRC error in the packet with its header decompressed by the packet receiver 704, and outputs only a correct packet. A successive error counter 705 counts the number of successive errors detected by the error detector 702. A successive decompression success counter 706 counts the number of decompression successes that successively appear. By referring to these counted numbers, an update request unit 708 transmits an update request to a transmitting side as required. A reference information manager 707 manages the reference information for header decompression. With this structure, the header decompression apparatus can request update of the reference information based on the state of the error.

12 Claims, 10 Drawing Sheets

OTHER PUBLICATIONS

Burmeister, C., et al. "Robust Header Compression", IETE, Jun. 29, 2000 (draft-ietf-rohc-rtp-00.txt).

Carsten Bormann et al., "Robust Header Compression (ROHC)", Internet Draft, Online! Jul. 14, 2000. pp. 1-34, XP002247470, Retrieved from the Internet: <URL:http//www.watersprings.org/pub/id/draft-ietf-rohc-rtp-01.txt> retrived on Jul. 14, 2003! Sections 2 'Terminology' and 3.1 'Header compression fundamentals': * p. 7-p.11 * Section 4.4.3. 'Bi-directional reliable mode': *p.16 - p.18*.

ROHC Mailing List Archive, Online! Jul. 10, 2000, pp. 1-9, XP002247471, ROHC mailing list archive, Retrieved from the Internet: <URL:http//www.cdt.luth.se/rohc/msg00559.html> retrieved on Jul. 14, 2003! Section 1.2 'Dealing with residual bit errors': *p. 4* .

* cited by examiner

APPARATUS AND METHOD FOR HEADER DECOMPRESSION

This is a Divisional Application of U.S. application Ser. No. 09/948,765, filed Sep. 10, 2001.

BACKGROUND OF THE INVENTION

1. Field of the Invention

The present invention relates to methods for header compression/decompression in packet transmission and, more specifically, to a method for header compression/decompression, where reference information is requested to be updated when an error occurs in packet transmission.

2. Description of the Background Art

Typical protocols recently known for data transmission over the Internet include TCP/IP (Transmission Control Protocol/Internet Protocol) and UDP/IP (User Datagram Protocol/Internet Protocol). In data transmission under such transmission protocol over a low and midrange bit rate transmission path, the header specified by TCP, UDP, IP, or other protocols is larger in size, disadvantageously causing overhead associated with communication. For example, to transmit 10-byte data under UDP/IP, the transmitting side has to add a 28-byte header to the original data, resultantly forming a 38-byte packet, which is approximately four times larger in size than the original data. If such increase in size happens quite often, the transmission path is substantially decreased in effective speed.

Figure 5:
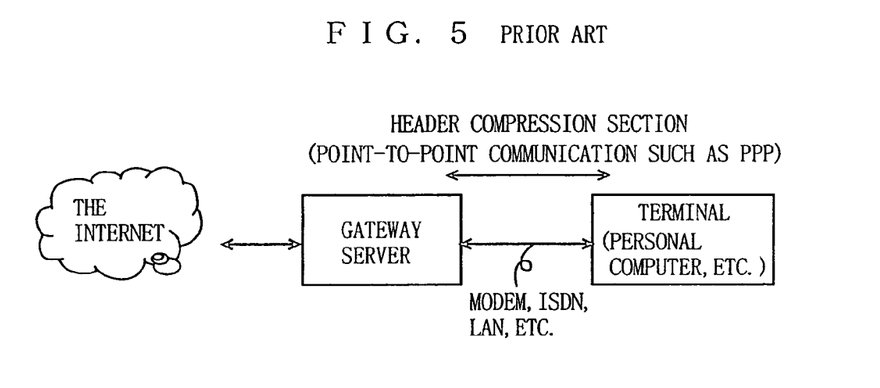
FIG. 5 is a diagram showing a header compression section in wired communication.

In order to reduce communication overhead caused by the header, a header compression scheme developed by V. Jacobson and defined in RFC 1144 and RFC2508 has been known. In this scheme, among the fields of the header included in the packet, transmitted are only any field changed in value from the one included in the previous packet. There are not many fields that change in value in the header, and therefore, in this scheme, header compression is successfully carried out. This header compression scheme, however, is a standard for wired communication with a low transmission error rate, as shown in FIG. 5, and is not efficient for a transmission path with a high transmission error rate.

Figure 6:
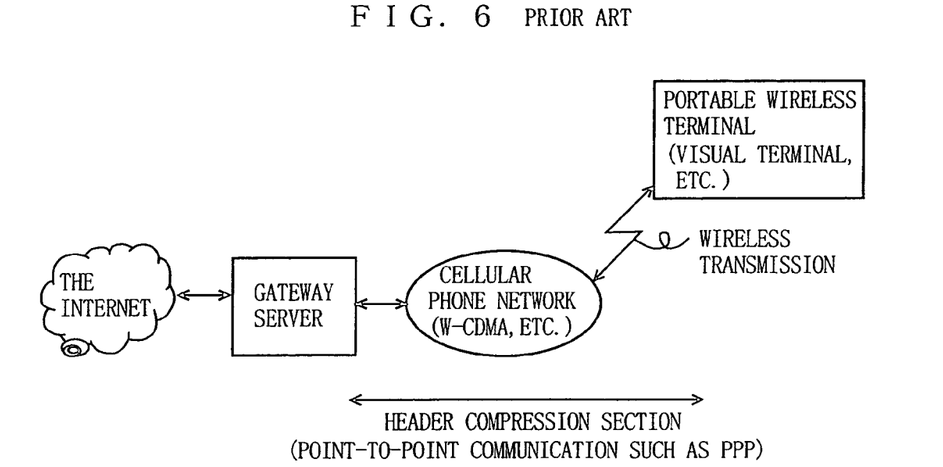
FIG. 6 is a diagram showing a header compression section in wireless communication.

FIG. 6 shows a communication network for wireless terminals over a cellular phone network such as W-CDMA. In recent years, the number of users of such communication network is rapidly growing. The communication network of FIG. 6 includes a wireless transmission section where errors frequently occur. To reduce overhead caused by the header in a wireless section, one header compression scheme is known as ROHC (RObust Header Compression) studied by IETF (Internet Engineering Task Force). The detail of ROHC is described in "draft-ietf-rohc-rtp-00.txt (29 Jun. 2000)".

Figure 7:
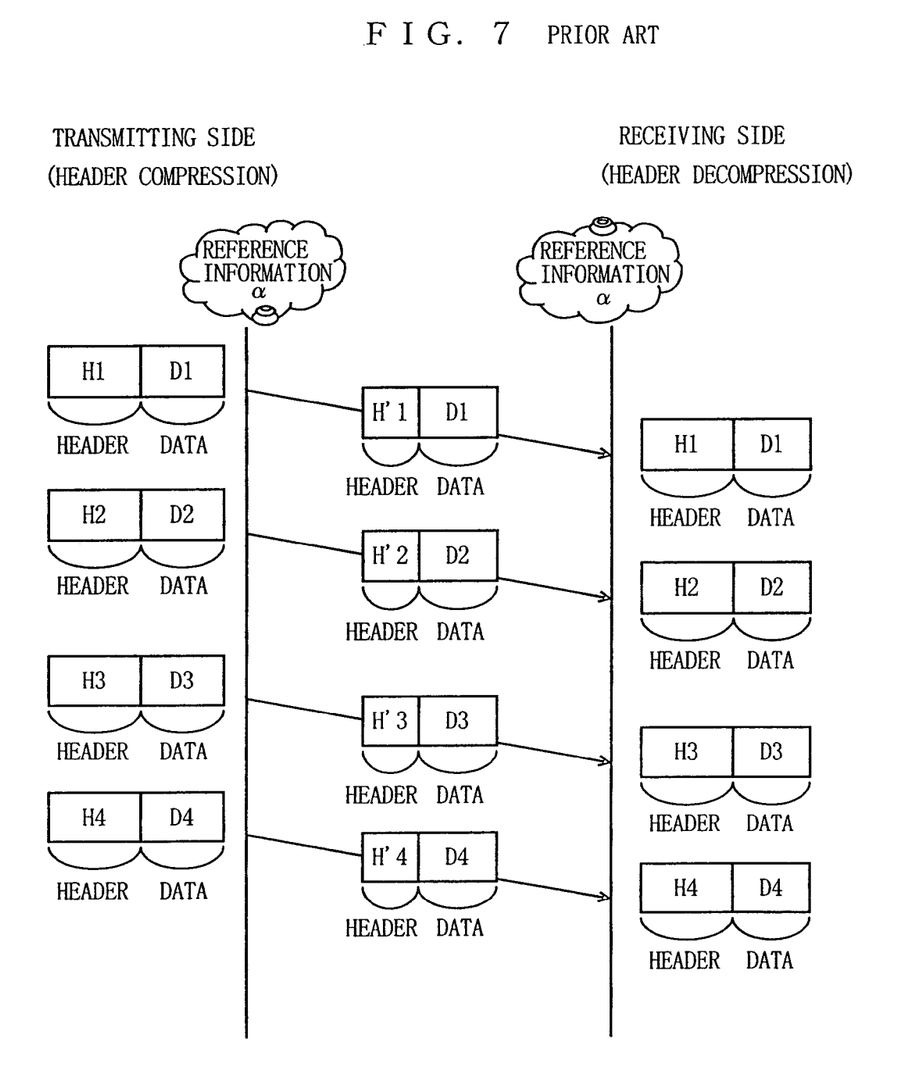
FIG. 7 is a diagram exemplarily showing data transmission under a conventional header compression scheme of ROHC.

In ROHC, for data compression at the transmitting side (compressing side) and data decompression at the receiving side (decompressing side), reference information is shared by both sides for reference. That is, the reference information referred to for data compression at the transmitting side is also referred to for data decompression at the receiving side. By sharing the reference information, data decompression can be correctly achieved. FIG. 7 shows one example of data transmission adopting ROHC.

In FIG. 7, at the start of data transmission, the transmitting side and the receiving side each have held correct reference information a Consider first a case where the transmitting side transmits a header H1 and data D1 to the receiving side. Before transmission, the transmitting side carries out data compression on the header H1 by referring to the reference information α. Here, the header H1 and a compressed header H'1 for transmission to the receiving side have such a relation as represented by the following equation (1).

$$H'1 = H1 * \alpha \qquad (1).$$

In the above equation (1), an operation represented by * varies for each field of the header to be compressed. For example, the operation is so carried out as follows: the field does not vary if representing a UDP port number; the field is generally increased in value by 1 if representing an RTP sequence number; and the field is increased in value by 50 if representing an RTP timestamp.

As such, the reference information α includes all information required for compression of each field as described above. Therefore, if the receiving side holds the correct reference information α having the same contents as that held in the transmitting side, the receiving side can correctly decompress the received compressed header H'1 into the original header H1, thereby obtaining the correct header H1 and data D1. Similarly, headers and data H2 and D2, H3 and D3, and H4 and D4 are transmitted after each header is compressed by referring to the reference information α.

Figure 8:
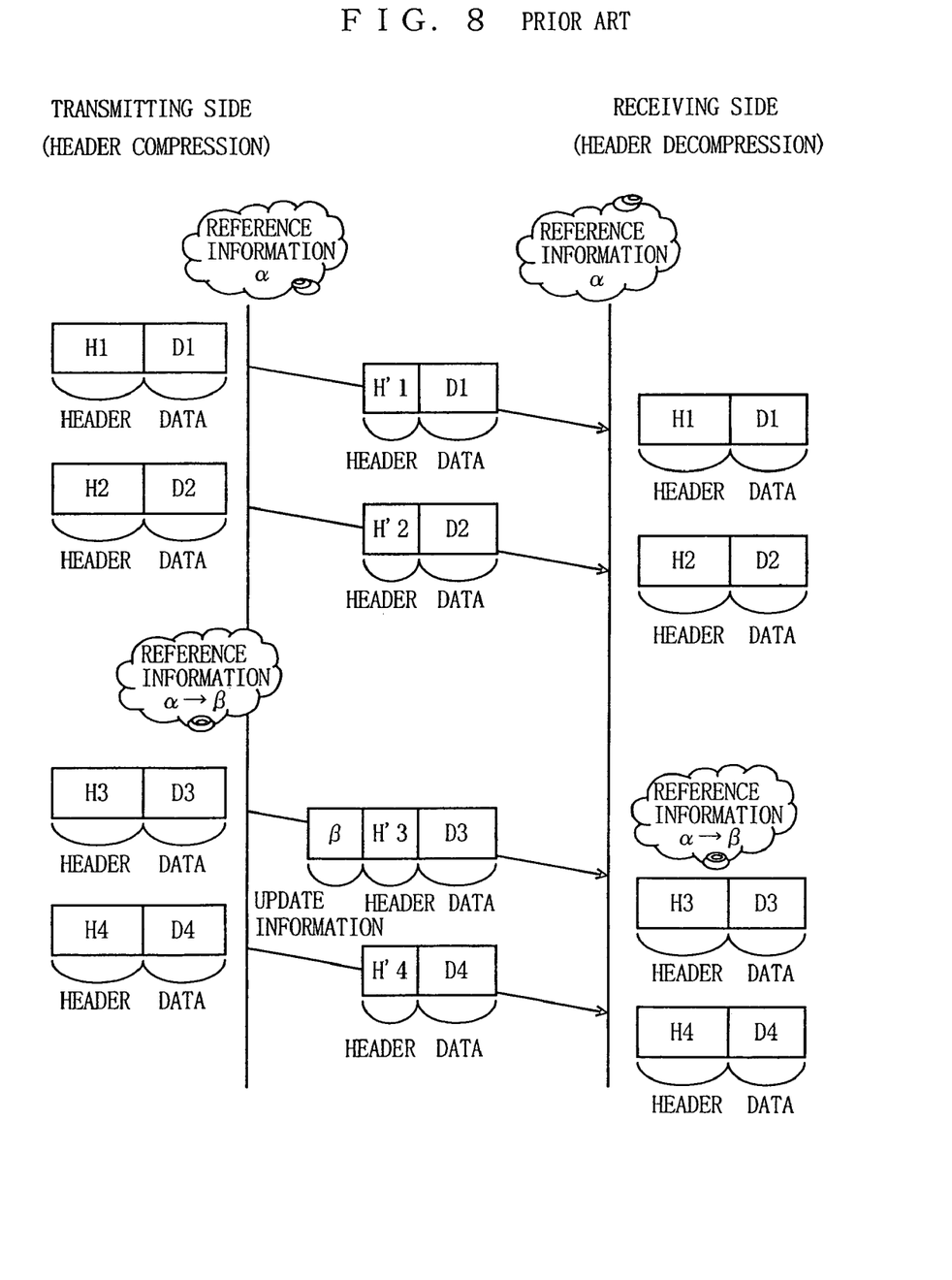
FIG. 8 is a diagram showing an example of data transmission where reference information is changed during the transmission in conventional header compression.

Next, consider a case where the reference information is changed. FIG. 8 shows an example of data transmission where the reference information is changed during the transmission. In FIG. 8, after the header H2 and the data D2 are transmitted, the reference information is changed from α to β, and the header H3 is compressed by referring to the changed reference information β.

For example, assume that the RTP timestamp of the header to be transmitted is increased by 50, but, at the time of transmission of the data D3, such increase is changed to by 100. Under this assumption, the transmitting side changes the reference information α held so far containing that "The RTP timestamp is increased by 50" into the reference information β containing that "The RTP timestamp is increased by 100". To update the reference information, as shown in FIG. 8, the receiving side refers to update information further provided to the compressed header to be transmitted (here, a header H'3).

In some cases, the reference information may be updated even if the update information is not explicitly transmitted. One example header compression scheme taken in such cases is briefly described below. In the compressed header, the sequence number is assigned 4 bits capable of representing integers from 0 to 15, but not 16 or more. Therefore, any integer N equal to 16 or more is represented by Nmod16. Thus, the receiving side finds the sequence number by using an equation L*16+(received sequence number), where L is incremented by 1 whenever the received sequence number is changed from the maximum value (here, 15) to the minimum value (here, 0). Here, the update information is not explicitly transmitted. Instead, when the sequence number becomes larger than the maximum value, the reference information is updated on both sides.

Figure 9:
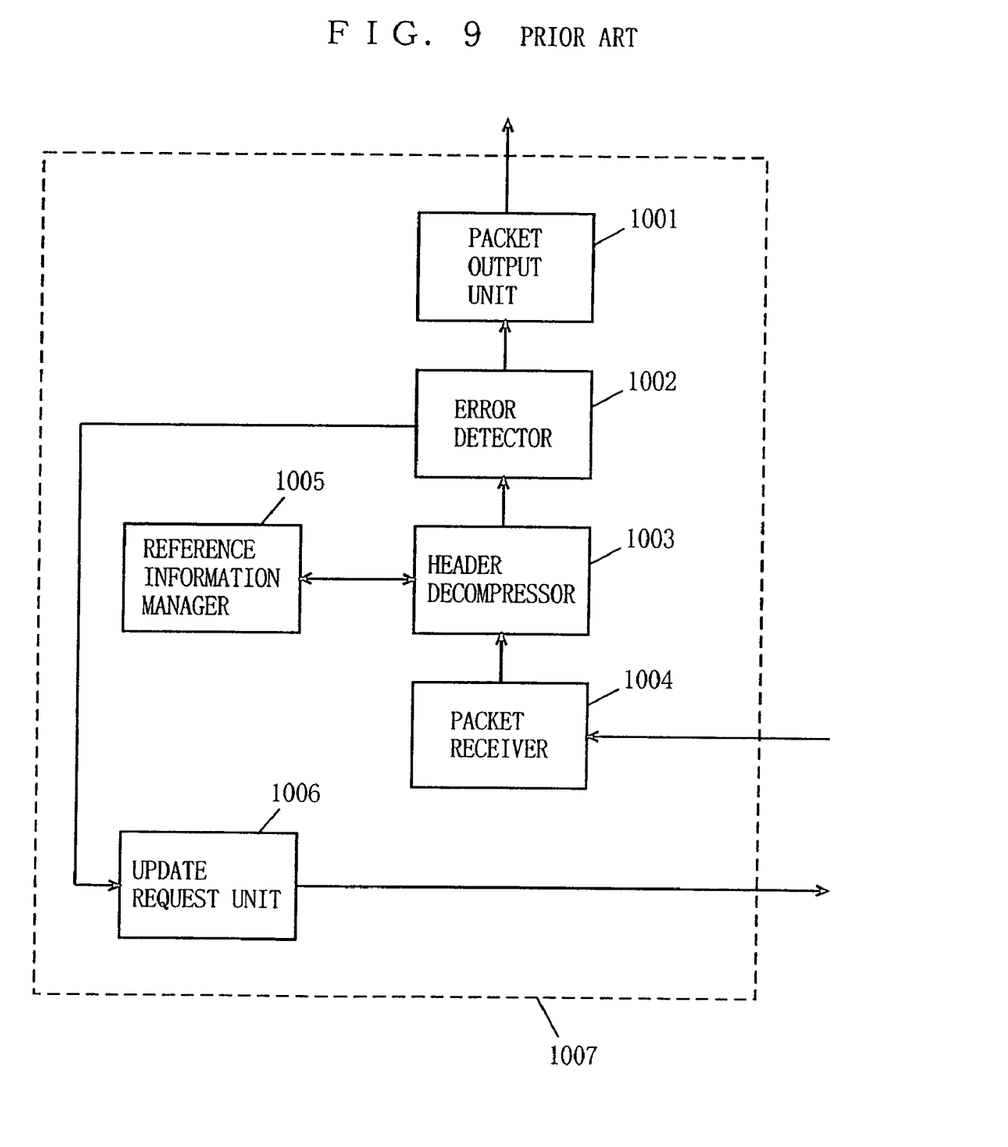
FIG. 9 is a block diagram showing the structure of a header decompression apparatus that achieves the header decompression in conventional art.

FIG. 9 is a block diagram showing the structure of a header decompression apparatus that achieves the header decompression as described above.

In FIG. 9, a header decompression apparatus 1007 includes a packet output unit 1001, an error detector 1002, a header decompressor 1003, a packet receiver 1004, a reference information manager 1005, and an update request unit 1006.

The packet receiver 1004 receives a header-compressed packet from a transmitting side, and outputs the packet to the header decompressor 1003. The header decompressor 1003 refers to reference information managed by the reference information manager 1005 to decompress the compressed header, and outputs the header-decompressed packet to the error detector 1002. If the compressed header is provided with update information, the header decompressor 1003 updates the reference information managed by the reference information manager 1005 with the update information provided to the compressed header. The error detector 1002 detects any error in the header-decompressed packet. If no error is detected, the error detector 1002 outputs the correctly-decompressed packet to the packet output unit 1001. If an error is detected, the error detector 1002 discards the packet as not having been correctly decompressed. The update request unit 1006 receives a notification that an error is detected by the error detector 1002, and transmits an update request to the transmitting side. Specifically, according to the above document, "draft-ietf-rohc-rtp-00.txt (29 Jun. 2000)", the update request unit 1006 transmits a NACK packet. The reference information manager 1005 manages the reference information for header decompression. The packet output unit 1001 outputs the header-decompressed packet.

As such, the header decompression apparatus 1007 detects any error in the compressed header. Here, typically, the compressed header is provided with a CRC (Cyclic Redundancy Code) for determining whether the header-decompressed packet has any error. Therefore, any error that occurred in the compressed header or a payload due to noise during wireless transmission can be detected, and the erroneous packet can be discarded.

Figure 10:
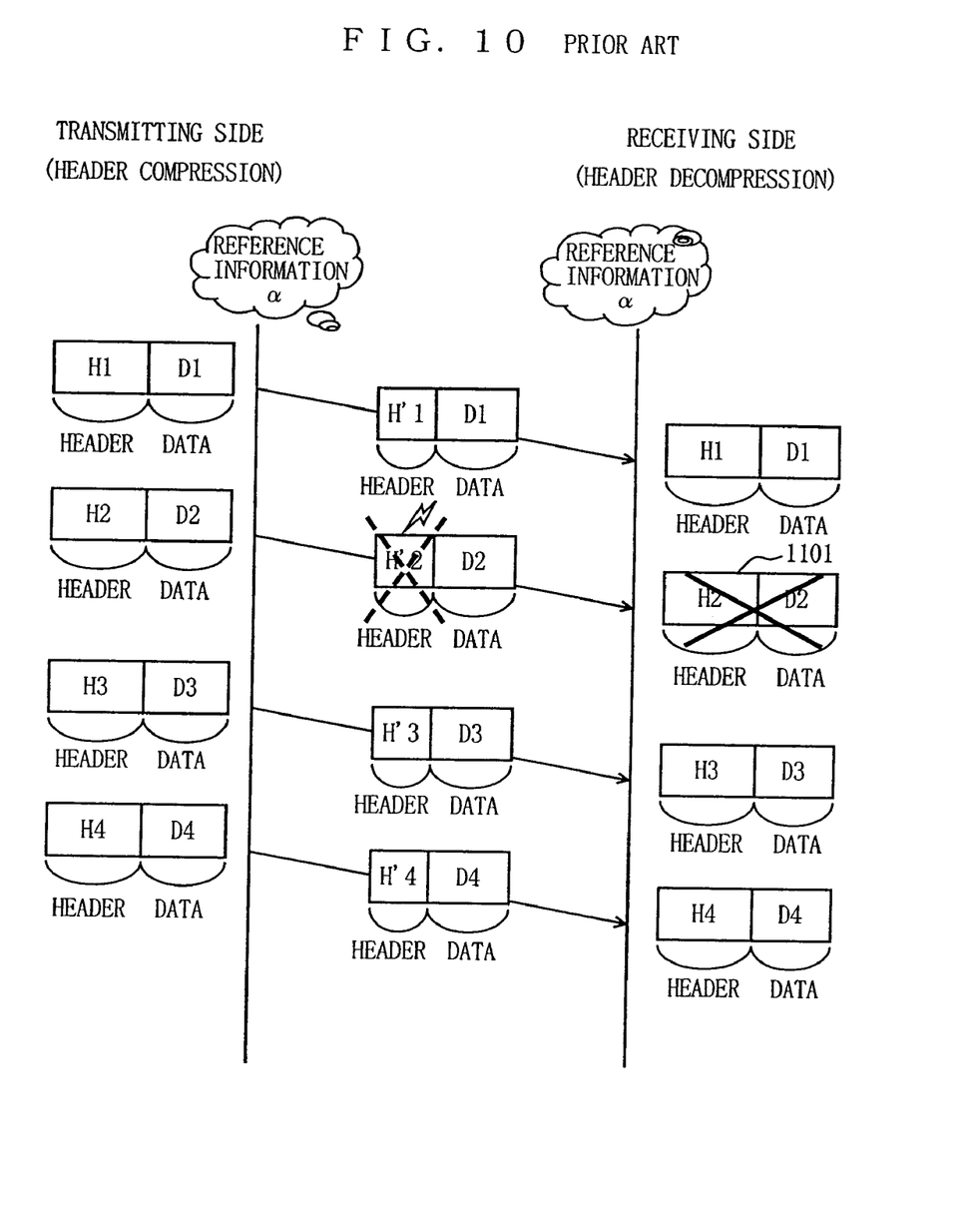
FIG. 10 is a diagram showing one example of data transmission where an error occurs due to noise during wireless transmission in the conventional header compression.

FIG. 10 shows one example of data transmission where an error occurs due to noise during wireless transmission. In FIG. 10, a header H2 is compressed to be a header H'2, and the header H'2 and data D2 are wirelessly transmitted. During the wireless transmission, noise or other factors affect the compressed header H'2, causing an error, which is denoted by a dotted cross in FIG. 10. As a result, as denoted by a solid cross in FIG. 10, the header cannot be correctly decompressed at the receiving side, and therefore the entire packet is discarded.

Figure 11:
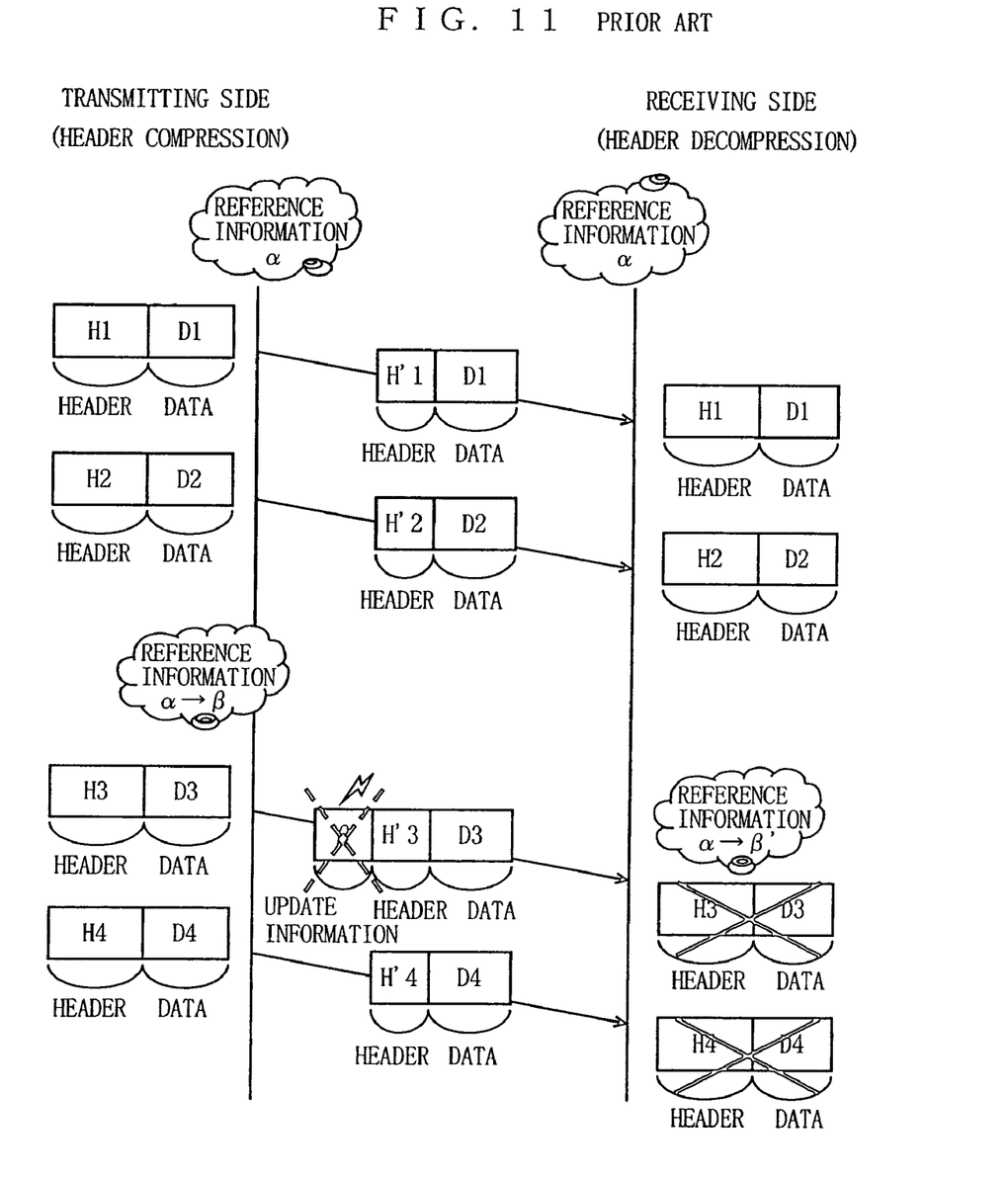
FIG. 11 is a diagram exemplarily showing a case where, in the conventional header compression, an error occurs in the header with reference update information provided thereto, and the reference information is erroneously updated.

Such error as described above may occur also in the compressed header with the update information provided thereto. FIG. 11 exemplarily shows a case where an error occurs in the header with the update information provided thereto, and the reference information is erroneously updated. In FIG. 11, a header H3 is compressed to be a header H'3, and the header H'3 and data D3 is wirelessly transmitted. During the wireless transmission, noise or other factors affect the update information provided to the compressed header H'3, causing a change in the update information, which is denoted by a dotted cross in FIG. 11. Therefore, at the receiving side, the reference information is erroneously updated to reference information β', based on the changed update information, and the header H3 decompressed by referring to the erroneous reference information is not the same as the original header H3 before compression at the transmitting side. This also applies to the following headers H4 and thereafter. As a result, as denoted by a solid cross in FIG. 11, the header cannot correctly decompressed at the receiving side, and is generally regarded as having an error. Therefore, the entire packet is discarded.

Figure 12:
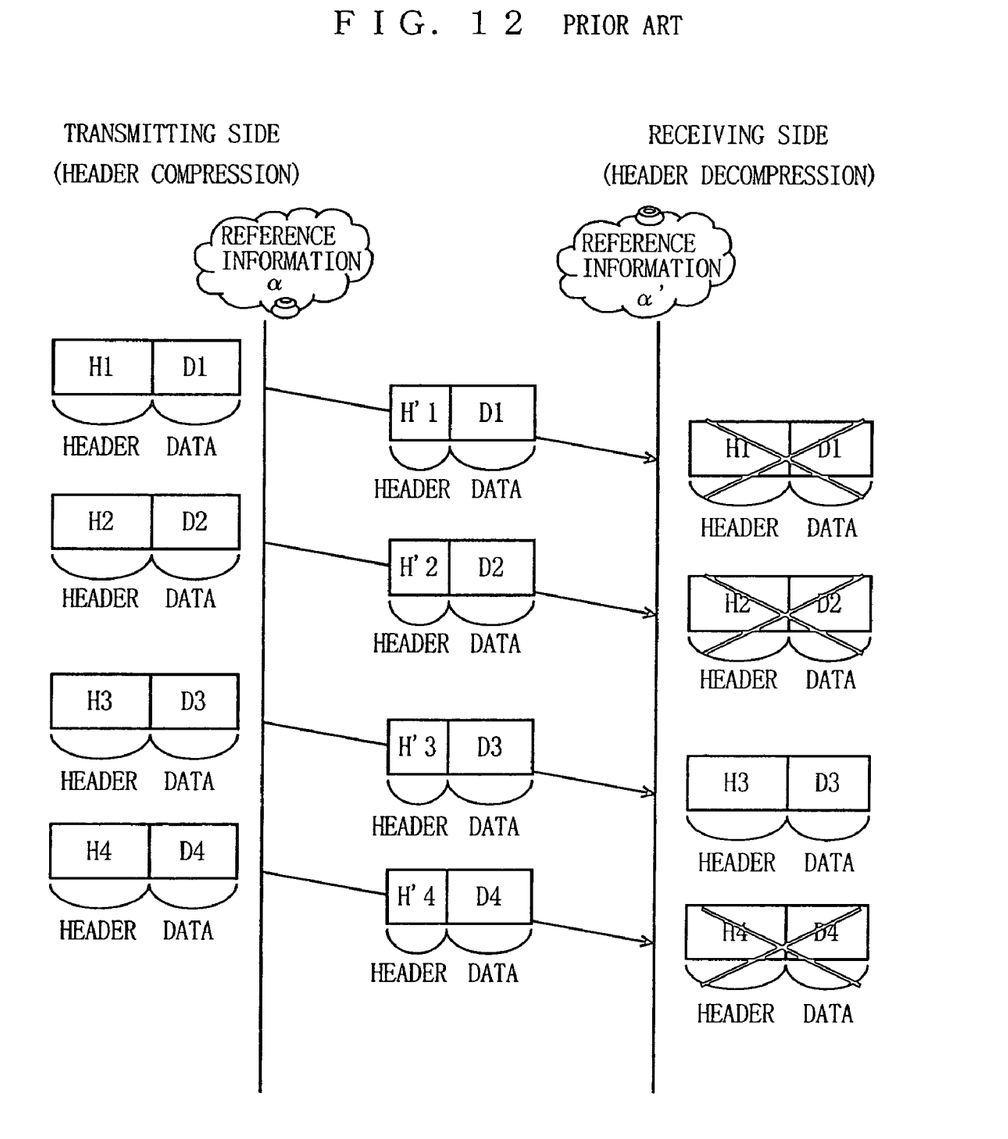
FIG. 12 is a diagram exemplarily showing a case where, in the conventional header compression, a packet is not regarded as having an error even if the reference information is erroneously updated.

In some cases, however, the header is not regarded as having an error even if it has not been correctly decompressed, and therefore the packet is not discarded. FIG. 12 exemplarily shows a case where a packet is not regarded as having an error even if the reference information is erroneously updated. In FIG. 12, the reference information is erroneously updated at the receiving side to become receiving-side reference information α', which is different from the reference information α at the transmitting side. As a result, headers H1 to H4 are erroneously decompressed at the receiving side. Therefore, in general, CRC errors occur and the entire packet are discarded. However, according to principles of CRC, not all errors cannot be detected, and any erroneously-decompressed header may be accidentally determined as being correct. In FIG. 12, a packet containing the header H3 and the data D3 is accidentally determined as being correct, and is not discarded.

As stated above, even if no error is detected, there may be a decompression error caused by noise or erroneous reference information. Also, even if one decompression error is detected, it is impossible to tell the cause of the decompression error, that is, either noise or erroneous reference information. Therefore, according to the above background art, an update request typified by NACK is transmitted whenever an error occurs. Such update request, however, is unnecessary when the reference information is correct and the error is caused only by noise. Thus, according to the background art, the more errors caused by noise, the more unnecessary update requests are transmitted, and therefore the lower header compression efficiency becomes.

SUMMARY OF THE INVENTION

Therefore, an object of the present invention is to provide a header decompression method in which only a necessary request for updating reference information is made based on the state of an error in a header-decompressed packet.

The present invention has the following features to attain the object above.

A first aspect of the present invention is directed to a header decompression apparatus for decompressing a compressed header of a packet for transmission by referring to reference information being the same as reference information referred to for header compression by a transmitting side. In the apparatus, a packet receiver receives the packet from the transmitting side. A reference information manager stores and manages the reference information. A header decompressor is provided with the received packet, and carries out header decompression by referring to the reference information stored in the reference information manager. An error detector detects an error in the packet including the decompressed header. A counter/storage counts and stores the number of errors detected by the error detector. An update request unit transmits, to the transmitting side, update information for updating the reference information, when determining, based on the number counted by the counter/storage, that the reference information stored in the reference information manager should be updated. When the update information is transmitted from the transmitting side, the reference information manager updates the reference information stored in the reference information manager based on the transmitted update information.

As described above, in the first aspect, based on the error detection results in the counter/storage, the update request unit determines whether the reference information should be updated. Thus, the number of packets to be discarded due to error in the reference information can be reduced, and efficient packet transmission can be achieved.

According to a second aspect, in the first aspect, the counter/storage includes a successive error counter and a successive decompression success counter. The successive error counter counts and stores the number of times X the packet having the error detected by the error detector successively appeared. The successive decompression success counter counts and stores the number of times Y the packet having no error successively appeared after the error detector detects the error.

Moreover, the update request unit determines, based on values of X and Y counted by the counter/storage, whether the reference information stored in the reference information manager should be updated.

As described above, in the second aspect, based on the number of decompression errors and decompression successes that successively appeared in the receiving side, an update request is transmitted to the transmitting side. Thus, the number of packets to be discarded due to error in the reference information can be reduced, and efficient packet transmission can be achieved.

According to a third aspect, in the second aspect, when $X \geq Y$, the update request unit determines that the reference information stored in the reference information manager should be updated.

As described above, in the third aspect, when $X \geq Y$, a large number of successive decompression errors have occurred, and therefore there is a high possibility that the reference information has an error. Thus, the number of packets to be discarded due to error in the reference information can be reduced, and efficient packet transmission can be achieved.

According to a fourth aspect, in the first aspect, the counter/storage counts and stores the number of packets W previously received and the number of packets R having the error detected by the error detector. The update request unit determines, based on W and R counted by the counter/storage, that the reference information stored in the reference information manager should be updated when R is larger than a predetermined value.

As described above, in the fourth aspect, if the number of decompression errors in the packets previously received at the receiving side becomes large, an update request is sent to the transmitting side. Thus, the number of packets to be discarded due to error in the reference information can be reduced, and efficient packet transmission can be achieved.

Fifth to eighth aspects are directed to header decompression methods respectively corresponding to the above header decompression apparatuses. Ninth to eleventh aspects are directed to computer-readable recording media with programs respectively corresponding to the above header decompression methods. Twelfth to fourteenth aspects are directed to programs respectively corresponding to the above header decompression methods.

These and other objects, features, aspects and advantages of the present invention will become more apparent from the following detailed description of the present invention when taken in conjunction with the accompanying drawings.

DESCRIPTION OF THE PREFERRED EMBODIMENTS (First Embodiment)

Figure 1:
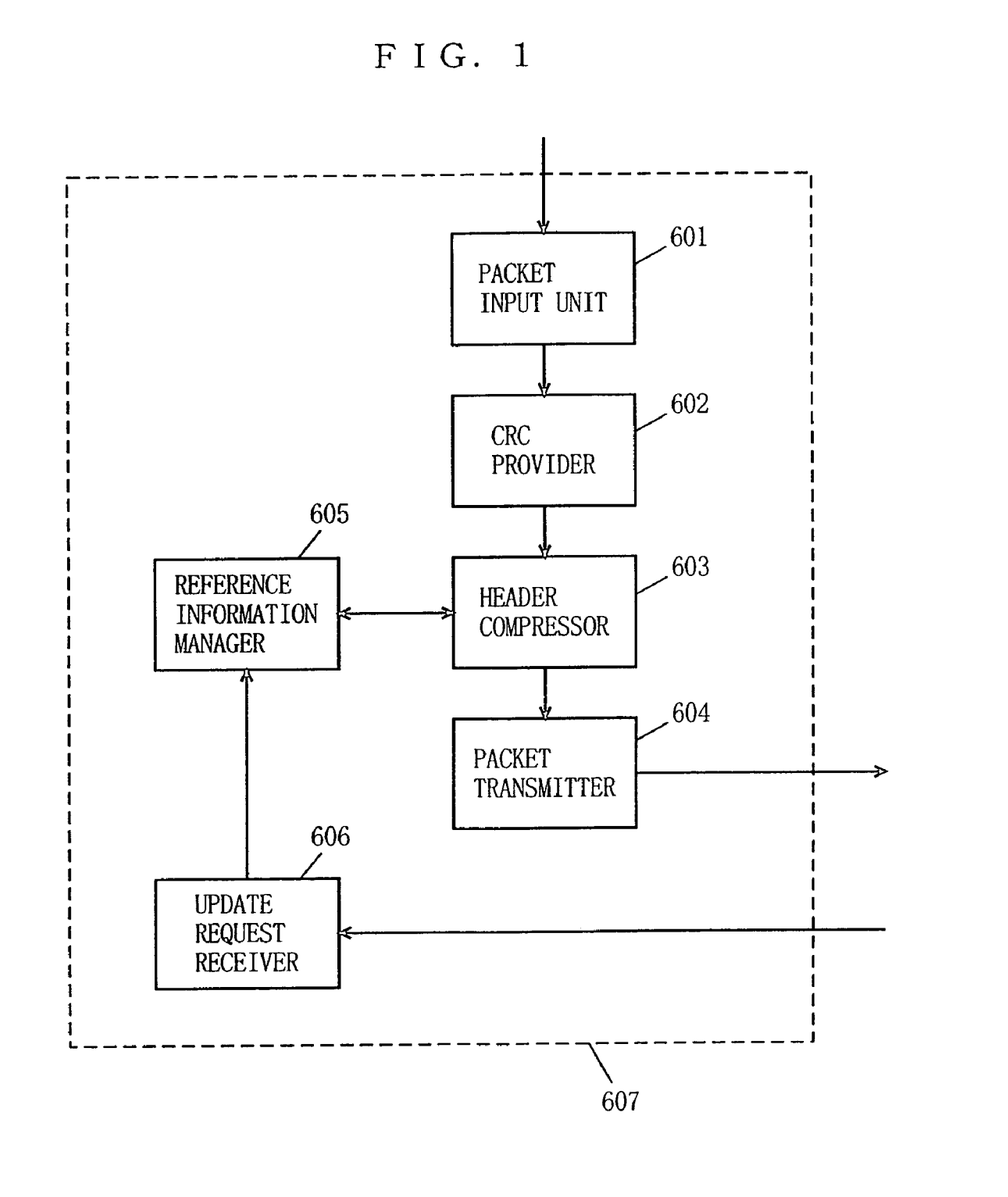
FIG. 1 is a block diagram showing the structure of a data compression apparatus 607 according to a first embodiment of the present invention.
Figure 2:
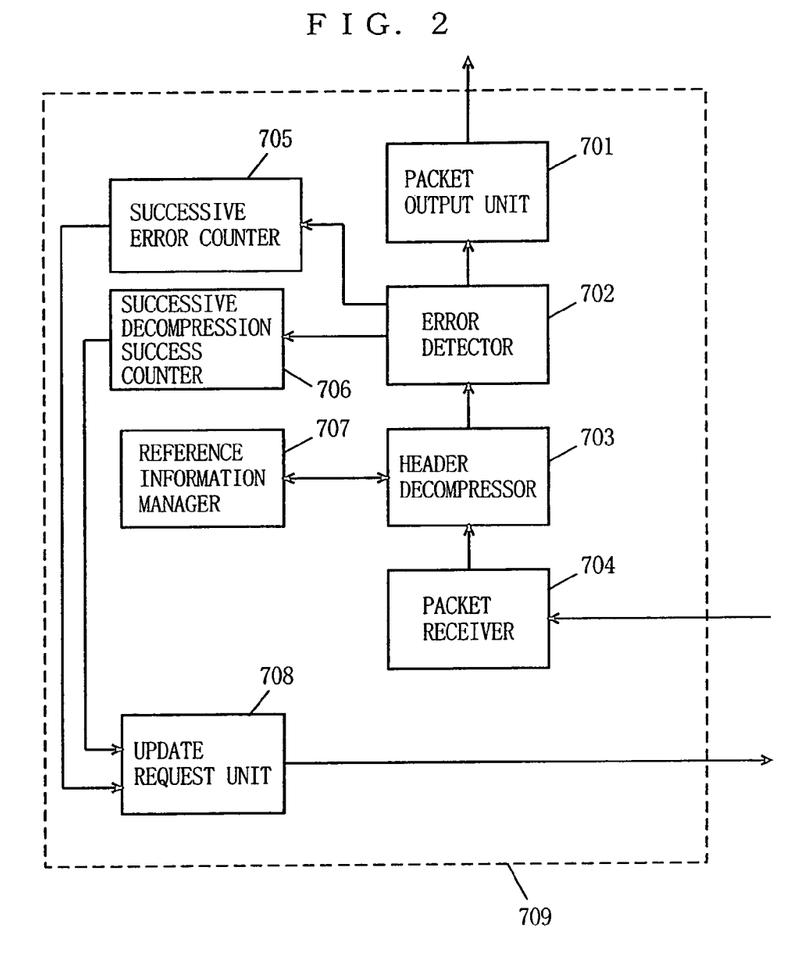
FIG. 2 is a block diagram showing the structure of a data decompression apparatus 709 according to the first embodiment of the present invention.

A method for header compression/decompression according to a first embodiment of the present invention is realized by a header compression apparatus and a header decompression apparatus as shown in FIGS. 1 and 2, respectively. With reference to the drawings, the structure of each apparatus is described below.

FIG. 1 is a block diagram showing the structure of a header compression apparatus 607. In FIG. 1, the header compression apparatus 607 includes a packet input unit 601, a CRC provider 602, a header compressor 603, a packet transmitter 604, a reference information manager 605, and an update request receiver 606.

The packet input unit 601 outputs a received packet to the CRC provider 602. The CRC provider 602 provides the received packet with a CRC for output to the header compressor 603. The header compressor 603 refers to reference information managed by the reference information manager 605 to compress the header of the received packet, and outputs the resultant packet to the packet transmitter 604. How to compress the header will be described later. The packet transmitter 604 transmits the received header-compressed packet to the receiving side. The reference information manager 605 manages the reference information referred to by the header compressor 603. The update request receiver 606 receives an update request from the transmitting side, and notifies the reference information manager 605 of the update request. The notified reference information manager 605 outputs the managed reference information to the header compressor 603, and instructs it to provide update information corresponding to the reference information to the compressed header.

FIG. 2 is a block diagram showing the structure of a header decompression apparatus 709. In FIG. 2, the header decompression apparatus 709 includes a packet output unit 701, an error detector 702, a header decompressor 703, a packet receiver 704, a successive decompression error counter (hereinafter, successive error counter) 705, a successive decompression success counter 706, a reference information manager 707, and an update request unit 708.

The packet receiver 704 receives, from the transmitting side, the header-compressed packet, and outputs it to the header decompressor 703. The header decompressor 703 refers to the reference information managed by the reference information manager 707 to decompress the compressed header, and outputs the resultant packet to the error detector 702. The error detector 702 detects a CRC error in the header-decompressed packet, and outputs, to the packet output unit 701, only any packet whose header has been correctly decompressed. The successive error counter 705 counts the number of successive decompression errors detected by the error detector 702. The successive decompression success counter 706 counts the number of successive decompression successes detected by the error detector 702. The update request unit 708 refers to the numbers counted by the successive error counter 705 and the successive decompression success counter 706 to determine whether an update request is required in a manner described later, and transmits the update request as required to the transmitting side. The reference information manager 707 manages the reference information for header decompression.

Note that, in the present invention, "successive" decompression errors mean that successive two or more error states are observed in a header, or that only one error state is observed therein, although the latter is not generally applicable to the meaning of the word "successive". Similarly, "successive" decompression successes means that successive two or more error-free states are observed in a header, or that only one error-free state is observed therein. How to determine "successive" states in the present invention will be described later.

Described specifically below are the operation of each of the above structured header compression apparatus and header decompression apparatus according to the present embodiment. Note that a packet supplied to the apparatuses contains data, such as video and audio, with an RTP/UDP/IP header.

First, the operation of the header compression apparatus shown in FIG. 1 is specifically described. The packet input part 601 outputs an externally-inputted RTP/UDP/IP packet to the CRC provider 602. The CRC provider 602 computes a CRC for the entire packet, and provides the CRC to the packet.

The header compressor 603 refers to the reference information managed by the reference information manager 605 for header compression. In this header compression, if the header can be decompressed with its sequence number, the reference information is not updated, and only the sequence number is included in the header. If the header cannot be decompressed with its sequence number, update information of the reference information and the sequence number are included in the header. The packet transmitter 604 transmits the header-compressed packet to the receiving side.

The reference information manager 605 stores and manages the reference information referred to by the header compressor 603. Notified by the header compressor 603 of an update, the reference information manager 605 updates the stored reference information. Notified by the update request receiver 606 that an update request has been received, the reference information manager 605 instructs the header compressor 603 to provide the update information to the header.

The update request receiver 606 receives an update request from the receiving side. On receiving the update request, the update request receiver 606 notifies the reference information manager 605 that the update request has been received.

Next, the operation of the header decompression apparatus 709 shown in FIG. 2 is specifically described. The packet receiver 704 receives the header-compressed packet transmitted from the packet transmitter 604 shown in FIG. 1, and outputs the packet to the header decompressor 703.

The header decompressor 703 refers to the reference information stored in the reference information manager 707 to decompress the compressed-header of the packet. The header-decompressed packet is outputted to the error detector 702. If the header is provided with update information, the header decompressor 703 notifies the reference information manager 707 of the update information.

The error detector 702 checks whether any error occurs or not in the header-decompressed packet by using the CRC. Also, the error detector 702 notifies the successive error counter 705 and the successive decompression success counter 706 of the presence or absence of an error. If any error is detected, the error detector 702 discards the packet. If an error is not detected, the error detector 702 outputs, to the packet output unit 701, the packet with the CRC removed therefrom. The packet output unit 701 externally outputs the error-undetected RTP/UDP/IP packet.

The reference information manager 707 stores and manages the reference information required for header decompression. If the compressed header includes the update information, the reference information manager 707 updates the stored reference information with the update information coming from the header decompressor 703.

The successive error counter 705 counts the number of successive errors X based on the error detection results in the error detector 702. For example, if an error is detected in a packet, X is 1. Then, if an error is detected also in the next packet, X becomes 2. Then, if an error is detected still in the following packet, X is further incremented by 1 to become 3. If no error is detected, successiveness is interrupted, and the error counter 705 stops counting.

The successive decompression success counter 706 counts the number of decompression successes Y based on the error detection results in the error detector 702. For example, if no error is detected in a packet, Y is 1. Then, if no error is detected also in the next packet, Y becomes 2. Then, if no error is detected still in the following packet, Y is further incremented by 1 to become 3. If any error is detected, successiveness is interrupted, and the successive decompression success counter 706 stops counting.

The update request unit 708 determines whether to request update based on a set of X outputted from the successive error counter 705 and Y outputted from the successive decompression success counter 706. This determination operation is further described in detail with reference to FIG. 3.

Figure 3:
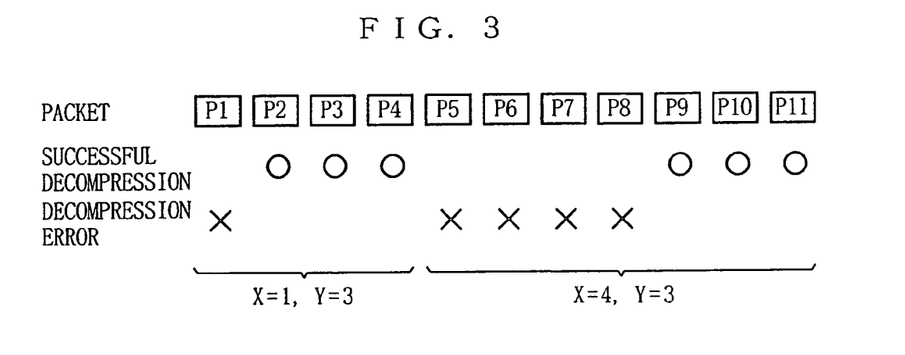
FIG. 3 is a diagram exemplarily showing the state of decompression and values of X and Y when a packet P1 to a packet P11 are received.

FIG. 3 is a diagram exemplarily showing decompression operation and values of X and Y when packets P1 to P11 are received. In FIG. 3, assume that an error occurred in a packet P12 not shown.

FIG. 3, an error is detected in the packet P1, and therefore X=1. In the packet P2, no error is detected, and therefore X is held as 1 and Y=1. Then, no error is detected from the packets P3 and P4, and therefore X=1 and Y=3. Then, when an error is detected in the packet P5, the values of X and Y for the packets P1 to P4 are regarded as a set representing the presence or absence of an error, and determined as X=1, Y=3. The values of X and Y for the packet P5 and there after are regarded as a new set. An error is detected in the packets P5 to P8, and therefore X=4. No error is detected in the packets P9 to P11, and therefore Y=3. Thereafter, when an error is detected in the packet P12, the values of X and Y for the packets P5 to P11 are regarded as a set, and determined as X=4 and Y=3.

As such, the update request unit 708 regards the values of X and Y as a set representing successive decompression errors and subsequent decompression successes, and compares these values with predetermined values. By way of example, when X is larger than 10 and smaller than 2, it is determined that an error occurs in the reference information, and requests the transmitting side of updating the reference information. These predetermined values are example only, and not restrictive. If $X \geq Y$, a large number of successive decompression errors have occurred, and therefore there is a high possibility that the reference information has an error.

As such, the header decompression apparatus 709 according to the present embodiment requests the transmitting side of updating the reference information based on the number of successive decompression errors and successes at the receiving side. Thus, the number of packets discarded due to error in the reference information can be reduced, and efficient packet transmission can be achieved. Such capability of the header decompression apparatus 709 can be achieved in a general-purpose computer system. In this case, this capability is realized by a program executed in the computer system. The program is typically stored in a recoding medium such as CD-ROM, or transmitted through a communication medium.

(Second Embodiment)

Figure 4:
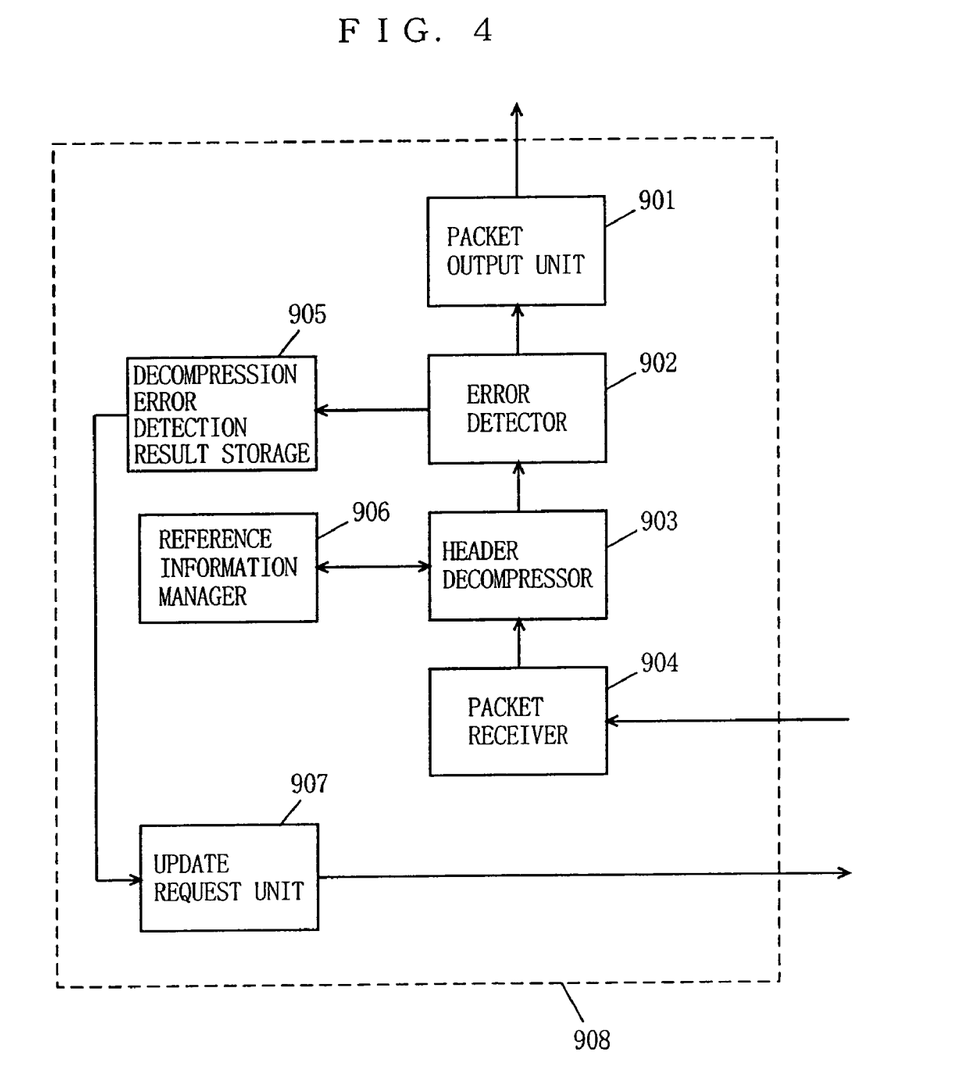
FIG. 4 is a block diagram showing the structure of a data decompression apparatus 908 according to a second embodiment of the present invention.

A method for header compression/decompression according to a second embodiment of the present invention is realized by a header compression apparatus and a header decompression apparatus as shown in FIGS. 1 and 4, respectively. Therefore, the header compression apparatus according to the second embodiment is the same in structure as the header compression apparatus 607 shown in FIG. 1, and not described herein. Described below is the structure of the header decompression apparatus according to the present embodiment with reference to FIG. 4.

FIG. 4 is a block diagram showing the structure of a header decompression apparatus 908. In FIG. 4, the header decompression apparatus 908 includes a packet output unit 901, an error detector 902, a header decompressor 903, a packet receiver 904, a decompression error detection result storage 905, a reference information manager 906, and an update request unit 907.

The packet receiver 904 outputs a header-compressed packet supplied from the transmitting side to the header decompressor 903. The header decompressor 903 refers to the reference information in the reference information manager 906 to decompress the compressed header, and outputs the resultant packet to the error detector 902. The error detector 902 detects any error in the header-decompressed packet, and outputs, to the packet output unit 901, any packet whose header has been correctly decompressed. The decompression error detection result storage 905 counts the number of errors or successes detected in the packet by the error detector 902 for storage. The update request unit 907 is supplied with the number counted by the decompression error detection result storage 905, determines whether an update request is required and transmits the update request as required to the transmitting side. The reference information manager 906 manages the reference information for header decompression.

Described specifically below is the operation of the above structured header decompression apparatus according to the present embodiment. Note that the operation of the header compression apparatus 607, that is, the transmitting side, is similar to that according to the first embodiment. Also assume that a packet supplied to the apparatuses contains data such as video and audio with an RTP/UDP/IP header.

In a header decompression apparatus 908 of FIG. 4, a packet receiver 904 receives a header-compressed packet transmitted from the packet transmitter 604 of FIG. 1, and outputs the packet to the header decompressor 903.

The header decompressor 903 refers to the reference information stored in the reference information manager 906 to decompress the compressed-header of the packet. The header-decompressed packet is outputted to the error detector 902. If the header is provided with update information of the reference information, the header decompressor 903 outputs the update information to the reference information manager 906.

The error detector 902 checks the presence or absence of an error in the header-decompressed packet by using the CRC. Also, the error detector 902 notifies the detection result to the decompression error detection result storage 905. If any error is detected, the error detector 902 discards the packet. If no error is detected, the error detector 902 outputs, to the packet output unit 901, the packet with the CRC removed therefrom. The packet output unit 901 externally outputs the error-undetected RTP/UDP/IP packet.

The reference information manager 906 stores and manages the reference information required for header decompression. If the compressed header includes the update information, the reference information manager 906 updates the stored reference information with the update information coming from the header decompressor 903.

The decompression error detection result storage 905 stores the detection results of the error detector 902, that is, the number of errors R for preceding W packets. Instead of W or R, the number of decompression successes may be stored.

The update request unit 907 determines whether to request update by comparing the values of W and R outputted from the decompression error detection result storage 905 with predetermined values. For example, if, among received 50 packets, 45 packets have errors, that is, W=50 and $R \geq 45$, the update request unit 907 determines that the reference information has errors equal to or more than a predetermined value, and requests the transmitting side to update the reference information. Note that the above values are example only, and not restrictive.

As described above, the header decompression apparatus 908 according to the present embodiment requests updating of the reference information when the number of decompression errors becomes relatively or substantially large in the packets previously received by the receiving side. Thus, the number of packets discarded due to error in the reference information can be reduced, and efficient packet transmission can be achieved. Such capability of the header decompression apparatus 908 can be achieved in a general-purpose computer system. In this case, this capability is realized by a program executed in the computer system. The program is typically stored in a recoding medium such as CD-ROM, or transmitted through a communication medium.

While the invention has been described in detail, the foregoing description is in all aspects illustrative and not restrictive. It is understood that numerous other modifications and variations can be devised without departing from the scope of the invention.

What is claimed is:

1. A header decompression apparatus for receiving a packet having a compressed header and decompressing the compressed header by referring to reference information, said apparatus comprising:
   a reference information manager for storing and managing said reference information;
   a header decompressor, provided with the received packet, for carrying out header decompression by referring to the reference information stored in said reference information manager;

an error detector for detecting an error in the packet including the header decompressed by said header decompressor;

a counter/storage for counting a number of packets having an error detected by said error detector from among the last W packets decompressed by said header decompressor; and an update request unit for transmitting an update request for requesting update of said reference information stored in said reference information manager, based on the values counted by said counter/storage, wherein W is a predetermined value stored in said counter/storage, and said counter/storage counts the number of packets R having an error detected by said error detector from among the last W packets decompressed by said header decompressor, wherein W is an integer and R is an integer.

2. The header decompression apparatus according to claim 1, wherein said update request unit determines, based on W and R counted by said counter/storage, that the reference information stored in said reference information manager has errors when R is equal to or more than a predetermined value.

3. The header decompression apparatus according to claim 2, wherein the predetermined value is determined based on W.

4. A header decompression method for receiving a packet having a compressed header and decompressing the compressed header by referring to reference information, said method comprising:

a header decompressing step, provided with the received packet, of carrying out header decompression by referring to the reference information;

an error detecting step of detecting an error in the packet including the header decompressed in said header decompressing step;

a counting/storing step of counting a number of packets having an error detected in said error detecting step from among the last W packets decompressed in said header decompressing step; and an update requesting step of transmitting an update request for requesting update of the reference information, based on the values counted in said counting/storing step, wherein W is a predetermined value stored in said counting/storing step, and said counting/storing step counts the number of packets R having an error detected in said error detecting step from among the last W packets decompressed in said header decompressing step, wherein W is an integer and R is an integer.

5. The header decompression method according to claim 4, wherein said update requesting step determines, based on W and R counted in said counting/storing step, that the reference information has errors when R is equal to or more than a predetermined value.

6. The header decompression method according to claim 5, wherein in said update requesting step, the predetermined value is determined based on W.

7. A computer-readable recording medium with a program recorded therein, the program being executed in a computer system for receiving a packet having a compressed header and decompressing the compressed header by referring to reference information, said program comprising:

a header decompressing step, provided with the received packet, of carrying out header decompression by referring to the reference information;

an error detecting step of detecting an error in the packet including the header decompressed in said header decompressing step;

a counting/storing step of counting a number of packets having an error detected in said error detecting step from among the last W packets decompressed in said header decompressing step; and an update requesting step of transmitting an update request for requesting update of the reference information, based on the values counted in said counting/storing step, wherein W is a predetermined value stored in said counting/storing step, and said counting/storing step counts the number of packets R having an error detected in said error detecting step from among the last W packets decompressed in said header decompressing step, wherein W is an integer and R is an integer.

8. The computer-readable recording medium according to claim 7, wherein in said update requesting step determines, based on W and R counted in said counting/storing step, that the reference information has errors when R is equal to or more than a predetermined value.

9. The computer-readable recording medium according to claim 8, wherein in said update requesting step, the predetermined value is determined based on W.

10. A program stored on a medium and executed in a computer system for receiving a packet having a compressed header and decompressing the compressed header by referring to reference information, said program comprising:

a header decompressing step, provided with the received packet, of carrying out header decompression by referring to the reference information;

an error detecting step of detecting an error in the packet including the header decompressed in said header decompressing step;

a counting/storing step of counting a number of packets having an error detected in said detecting step from among the last W packets decompressed in said header decompressing step; and an update requesting step of transmitting an update request for requesting update of the reference information, based on the values counted in said counting/storing step, wherein W is a predetermined value stored in said counting/storing step, and said counting/storing step counts the number of packets R having an error detected in said error detecting step from among the last W packets decompressed in said header decompressing step, wherein W is an integer and R is an integer.

11. The program according to claim 10, wherein said update requesting step determines, based on W and R counted in said counting/storing step, that the reference information has errors when R is equal to or more than a predetermined value.

12. The program according to claim 11, wherein in said update requesting step, the predetermined value is determined based on W.

* * * * *